United States Patent [19]

Volten

[11] Patent Number: 4,873,843
[45] Date of Patent: Oct. 17, 1989

[54] MULTIPLE SOURCE AND/OR SENSOR COLDHEAD MOUNT

[75] Inventor: Curt V. Volten, Chestnut Hill, Mass.
[73] Assignee: Spectra-Physics, Inc., San Jose, Calif.
[21] Appl. No.: 220,269
[22] Filed: Jul. 18, 1988
[51] Int. Cl.[4] .............................................. F25B 19/00
[52] U.S. Cl. ...................................... 62/51.1; 62/383; 250/352
[58] Field of Search .............. 62/514 R, 383; 250/352

[56] References Cited

U.S. PATENT DOCUMENTS

| | | | |
|---|---|---|---|
| 4,408,464 | 10/1983 | Salour et al. | 62/514 R |
| 4,495,782 | 1/1985 | Salour et al. | 62/514 R |
| 4,501,131 | 2/1985 | Gaskin et al. | 62/514 R |
| 4,571,954 | 2/1986 | Roberts et al. | 62/514 R |
| 4,575,629 | 3/1986 | Schnell et al. | 250/352 |
| 4,696,169 | 9/1987 | Niemann et al. | 62/514 R |

Primary Examiner—Ronald C. Caposella
Attorney, Agent, or Firm—Allegretti & Witcoff, Ltd.

[57] ABSTRACT

A refrigerated environment for multiple laser sources and/or sensors which provides the same thermal conditions in a single cold-cycle refrigerator for the sensors and sources. A mounting structure which comprises a cold-head assembly accomodating plural sensors or sources and positions them for radiation transfer with the ambient while they are held at consistent temperature relationships for efficient operation.

19 Claims, 4 Drawing Sheets

MULTIPLE SOURCE AND/OR SENSOR COLDHEAD MOUNT

FIELD OF THE INVENTION

This invention relates in general to laser systems, and more particularly, to a mounting structure which provides the ability to cool and operate multiple laser sources and/or laser sensors in a single refrigerated environment.

BACKGROUND OF THE INVENTION

Many solid state laser sources, or laser diodes, before they will emit the desired electromagnetic radiation, must be cooled to cryogenic temperatures while being excited to a lasing condition. Laser diodes are generally inefficient, however, and thus convert into laser radiation only a small portion of the excitation energy, releasing much of the remaining energy as heat. Moreover, the efficiency of laser diode devices decreases with an increase in temperature, and frequency of emission also changes with temperature. Similarly, laser sensors require cooled operating temperatures for optimal performance.

To remove heat and thus keep a laser source of sensor cooled to its preferred operating temperature, a closed-cycle cryogenic helium refrigerator is generally used. The refrigerator generally consists of a compressor, flexible high pressure gas transfer lines and a cold-head in which cooling actually takes place. The laser source or sensor is mounted on a heat conducting structure affixed in turn to a mounting station which is thermally coupled to a cold finger connected to the cryogenic refrigerator. The cold finger maintains low temperatures, in the 7°-10° K. range, from the mounting station and provides a heat sink to conduct heat from the helium refrigerator. A heater, which may be the source itself, is then connected to the mounting station to control it to the desired operating temperature for either a source or sensor. The entire structure is mounted within a housing to maintain the low temperature condition. A window is provided at the end of the housing so that the sensors or sources can receive or emit radiation from or to external instrumentation.

Cold-heads have previously only been able to cool a limited number of laser sources or sensors at one time. Cold-heads which can hold three laser detectors are known. Similarly, cold-heads which can hold four laser sources are known.

In addition, because sources and sensors generally operate at different temperatures, cold-heads have not permitted simultaneous mounting or operation of both laser sources and sensors. Instead, two separate cold-heads have been required, one for the laser source and another for the detector.

Because it takes approximately three hours to cool a cold-head mounting station to the desired temperature, the limitation in number and type of source and sensor devices which can be mounted thereto severely restricts the throughput of the number of detectors of sources which can be tested in a given period of time.

SUMMARY OF THE INVENTION

The present invention provides an apparatus for cooled operation of multiple laser detectors and laser sources in a single closed-cycle refrigerator, correspondingly improving the throughput of testing of sensors and sources. In one embodiment, a cold-head assembly for sensors is disclosed which permits operation and testing of up to eight laser detectors. In another embodiment, a cold-head assembly is disclosed which permits the operation and testing of up to ten laser sources in a single cooling cycle. In a third embodiment, a cold-head assembly is disclosed which permits simultaneous cooled operation of both laser sources and sensors in a single closed cycle refrigerator.

DESCRIPTION OF THE DRAWINGS

The invention will be more fully understood from the following detailed description, taken in conjunction with the accompanying drawings, in which.

DESCRIPTION OF THE PREFERRED EMBODIMENT

Figure 1:
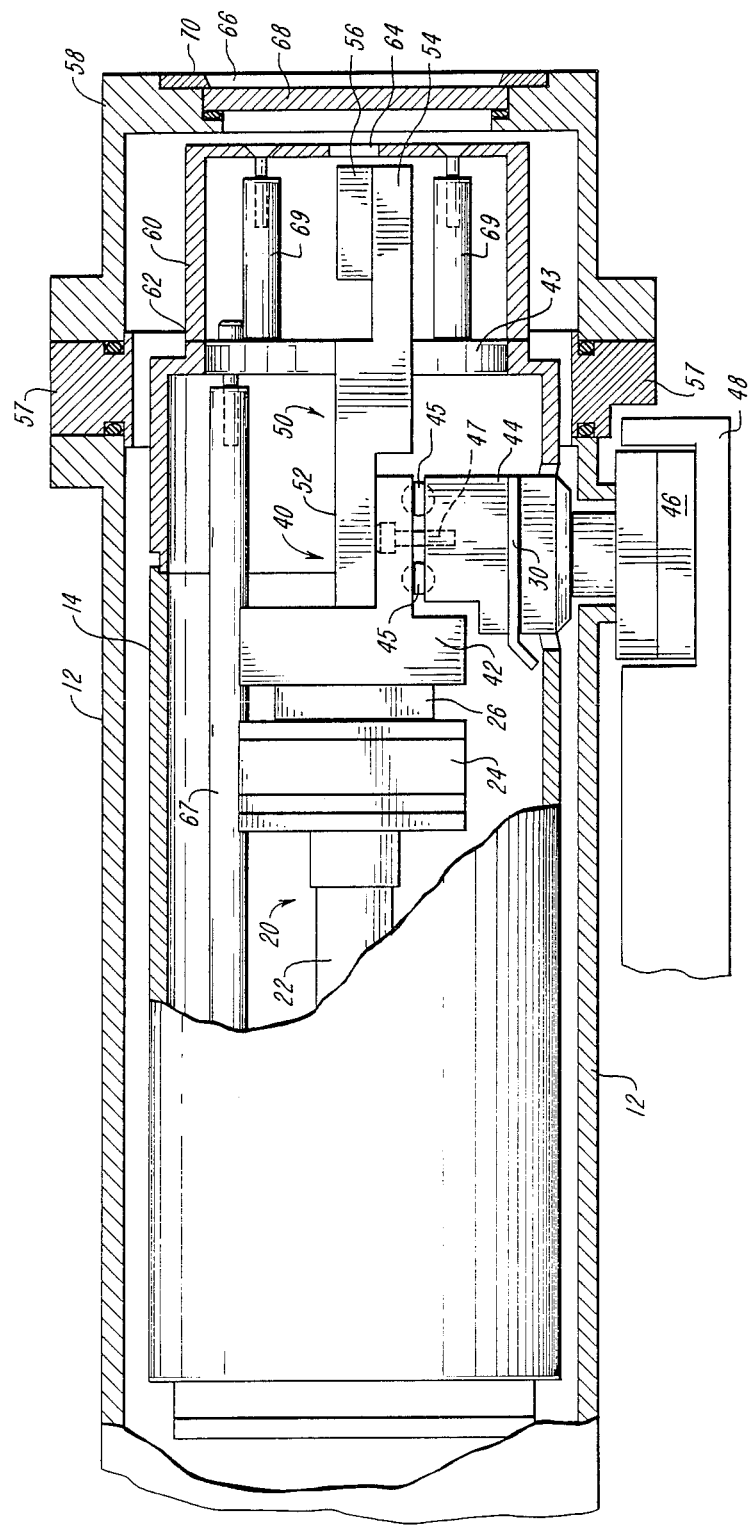
FIG. 1 is a cutaway view of a refrigerator unit having a cold-head assembly of the present invention.

With reference now to the drawings, there are shown preferred embodiments for apparatus to provide a cold-head mounting structure for multiple laser sources and/or sensors in a cold-cycle refrigerator. With reference to FIG. 1, a cutaway view of a refrigerator unit having a cold-head assembly with a multiple laser source cold-head assembly source support of the present invention is shown. A vacuum housing 12 encloses a cold-shield 14. The cold-shield 14 in turn encloses a cold finger assembly 20 and a mounting station assembly 40.

Cold finger assembly 20 protrudes from the motor portion of a cryogenic refrigerator (not shown), and includes a cold finger 22 which is generally constructed of oxygen-free high conductivity copper and which is connected in a mechanically rigid, thermally conductive fashion to the refrigerator. Cold finger 22 terminates in a copper-indium sandwich flange 24 which acts as a thermal fluctuation damper. The refrigerator has two stages--a first 77° K. stage, and a second stage to which the cold finger 22 is connected and which has a normal minimum operating temperature of about 7° to 10° K.

The flange 24 is connected by means of a thermal strap 26 to the moutning station assembly 40. Thermal strap 26 is designed to provide good thermal conductivity between the flange 24 and the mounting station assembly 40 with minimal transmission of vibration. While thermal straps are known, a good thermal strap is shown in U.S. patent application No. 162,270, filed on Feb. 29 1988, and invented by the same inventor and assigned to the same assignee as named herein.

The mounting station assembly 40 includes an insulating stand-off assembly 44 which is attached to a mount 42 by means of nylon balls 45 and set screw 47. Stand-off assembly 44 is in turn connected to housing support 46, which is connected through the vacuum housing 12 and cold-shield 14 to a mounting base 48.

Within the stand-off assembly 44 is a copper plate 30, which is generaly gold-plated. This plate is connected to the 77° K. stage by a thermal braid (not shown). The cold shield 14 is also connected to the refrigerator's 77° K. stage. In this way, the transfer of room temperature heat to the mount 42 via stand-off assembly 44 and the vacuum housing 12 is impeded.

Because the size of mount 42 is limited by the cross-section of the cold-shield 14, mount 42 can hold only a limited number of sensors or laser sources. To permit simultaneous operation of more sensors or sources than can be placed on mount 42, a modified cold-head assembly support is attached to amount 42 by means of reference pins (not shown) to prevent rotation and tightening screws (also not shown).

Figure 2:
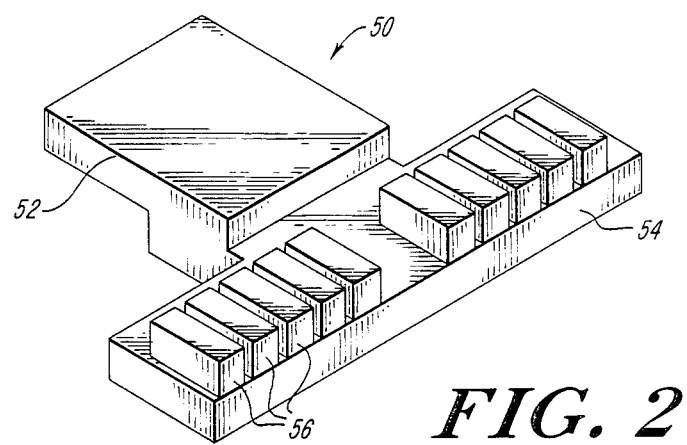
FIG. 2 is a perspective view of a multiple laser source cold-head assembly source support of the present invention.

With reference to FIGS. 1 and 2, a multiple laser source cold-head assembly source support 50 is shown. Source support 50 is T-shaped, with a first portion 52 and a perpendicular second portion 54. The source support 50 is made of oxygen-free high conductivity copper, which permits good thermal conductivity between the source support 50 and the mount 42. In the disclosed embodiment, ten laser diode sources 56 are affixed to source support 50 on its widened portion 54.

Figure 3:
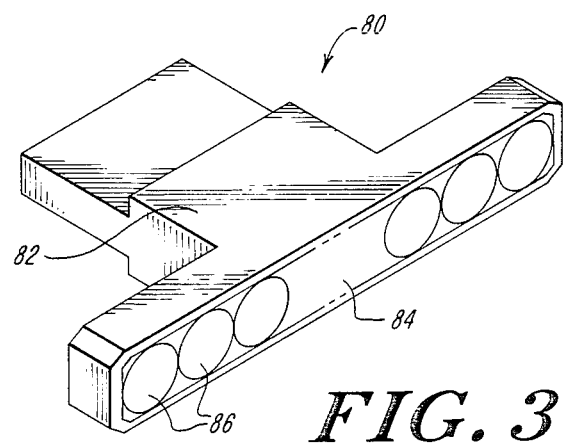
FIG. 3 is a perspective view of a multiple detector cold-head assembly detector support of the present invention.

The cold-head assembly of the present invention can also be applied to detectors. In FIG. 3, a T-shaped multiple detector cold-head assembly detector support 80 is shown having a first portion 82 and a perpendicular second portion 84. Multiple laser sensors 86 are inserted into this cold-head assembly detector support, in holes perpendicularly placed along the length of portion 84. Cold-head assembly detector support 80 is designed so as to put the light receiving plane of the laser sensors 86 in the same plane as the light transmitting plane of the laser sources 56 of FIGS. 1 and 2. As will be shown below, this permits the use of the same cold-shield and housing assemblies for both laser sources and sensors.

Figure 4:
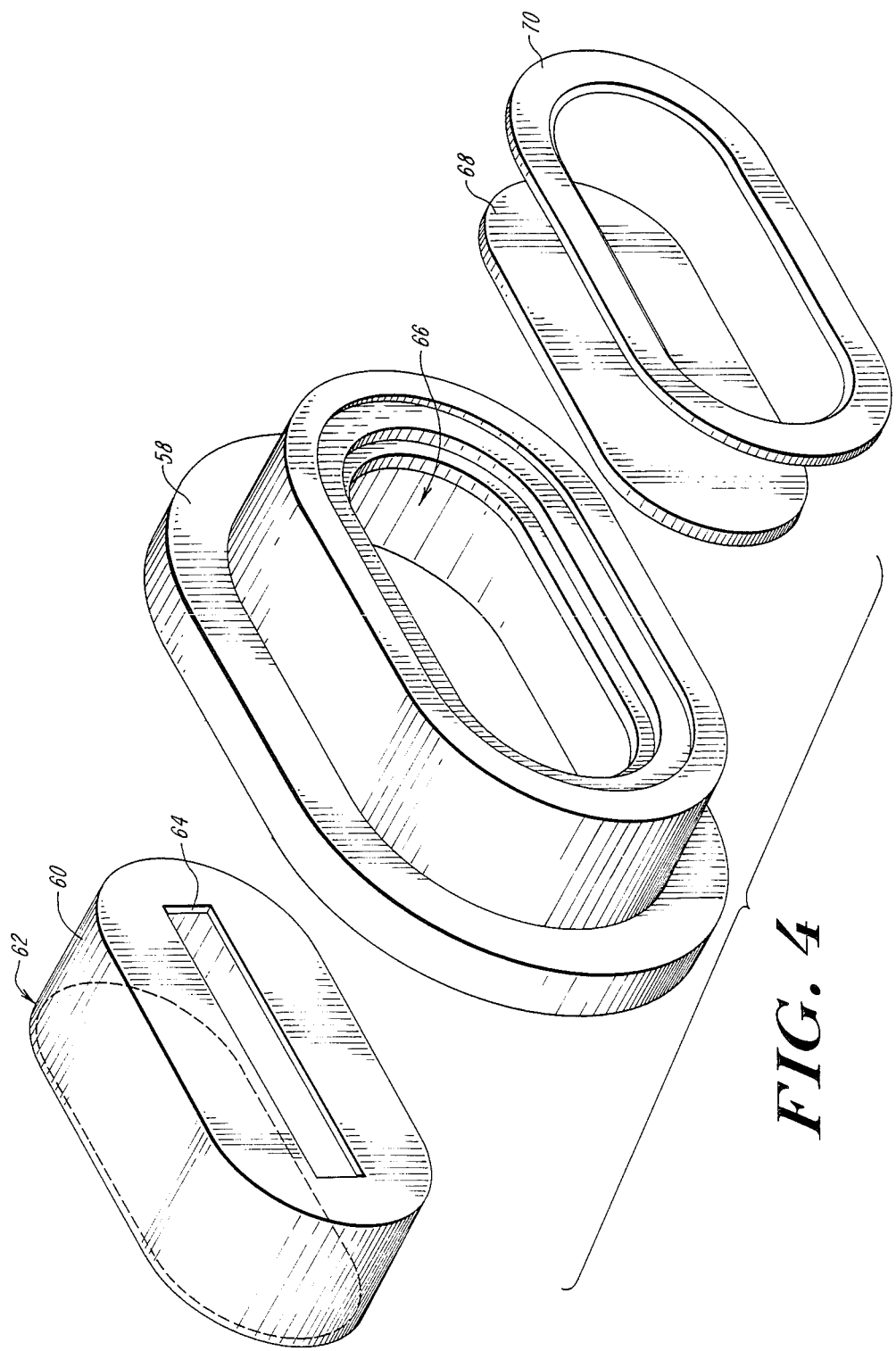
FIG. 4 is an exploded view of a refrigerator housing window assembly for use in the unit of FIG. 1.
Figure 5:
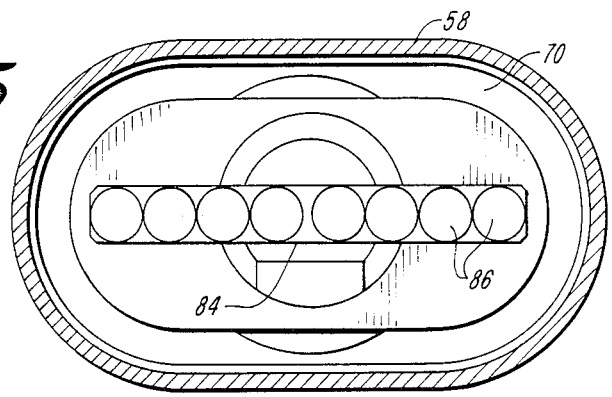
FIG. 5 is an end view of the refrigerator unit of FIG. 1 having an 8-detector cold-head assembly detector support of the present invention.

Because cold-head assembly source and sensor supports 50 and 80, respectively, extend beyond the end of the standard vacuum housing 12 and cold shield 14 of FIG. 1, shown at 43, a modified refrigerator housing window assembly must be used incorporating a housing extension 57, a housing cap 58 and a cold shield extension 60, as shown in FIGS. 1, 4 and 5. Cold shield extension 60 is preferably made of the same material as the cold shield 14, and is in thermal and mechanical contact with the cold shield 14 at a boundary 62. With reference to FIG. 4, the cold shield extension 60 has a rectangular aperture 64 which aligns with the laser sources 56 or sensors 86 to permit the passage of light. Similarly, housing cap 58 has a window 66 made of quartz or other infrared transmitting material 68 and held in place by a window retainer 70. Housing cap 58 is connected to housing 12 by means of a housing extension ring 57. Cold shield stand-offs 69, shown in FIG. 1, are provided for mechanical alignment and improved thermal conductivity, and are connected to two cold shield cap rods 67 (only one shown). Rods 67 and stand-offs 69 are used for mechanical alignment and support as well as for thermal conductivity.

Figure 6A:
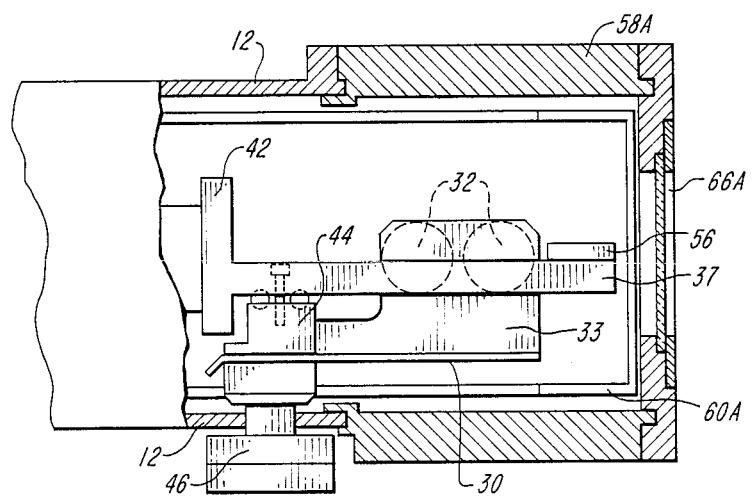
FIGS. 6A and 6B are side and top perspective views, respectively, of a combined laser source and sensor cold-head sensor and source support assembly of the present invention.
Figure 6B:
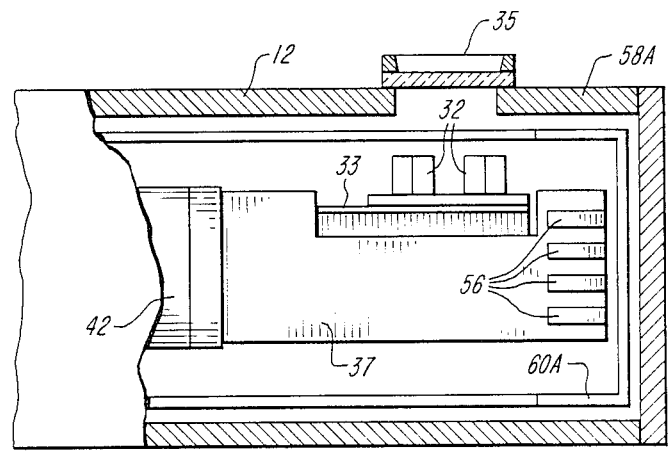

Finally, the present invention can be used to provide a cold-head extension for simultaneous operation of laser sources and sensors. With reference to FIGS. 6A and 6B, mount 42 is connected to the vacuum housing 12 and the housing support 46 by the insulating stand-off assembly 44. As previously described, a copper plate 30 is located in an intermediate portion of this stand-off assembly 44 and is thermally connected to the 77° K. first stage of the refrigerator. In this specific third embodiment of FIG. 6, plate 30 is extended horizontally beyond the stand-off assembly 44 and is then folded upwards at a right angle to create a mount 33 for two detectors 32. These detectors 32 are aimed out a side window 35, while four laser sources 56 can be mounted at a lower temperature on the cold-head sensor and source support assembly 37. The side window 35 allows light to pass through the housing cap 58A and cold-shield extension 60A, respectively, while the laser sources are aimed through a front window 66A. In this way, a single refrigerator environment permits simultaneous operation of both detectors and sources.

As is apparent from the present description, other modifications and alternative implementations will occur to those versed in the art without departing from the true spirit and scope of the invention. Accordingly, it is not intended to limit the invention to what has been particularly shown and described except as indicated in the appended claims.

What is claimed is:

1. A refrigerator environment for multiple laser sources and/or sensors comprising:
    a vacuum housing comprising:
        a first housing portion;
        a separate second housing portion longitudinally extending from said first housing portion; and
        a window opening at the end of said second housing portion to permit the passage of laser light;
    a cold-shield within said vacuum housing comprising:
        a first cold-shield portion;
        a second cold-shield portion longitudinally extending from said second cold-shield portion; and
        an aperture at the end of said second cold-shield portion to permit the passage of laser light;
    a cold-finger within said cold-shield thermally coupled to a cryogenic refrigerator; and
    a mounting station assembly comprising:
        an insulating stand-off assembly;
        a mount mechanically coupled to said stand-off assembly and thermally coupled to said cold-finger; and
        a cold-head assembly support thermally and mechanically coupled to said mount.

2. The apparatus of claim 1 wherein said cold-head assembly support has a first body portion and a second body portion substantially perpendicular to said first body portion.

3. The apparatus of claim 2 wherein said cold-head assembly support is T-shaped.

4. The apparatus of claim 2 further including a plurality of laser sources mounted to said cold-head assembly support.

5. The apparatus of claim 4 wherein said plurality of laser sources includes at least ten laser sources.

6. The apparatus of claim 2 further including a plurality of laser sources mounted to said cold-head assembly support.

7. The apparatus of claim 6 wherein said plurality of laser sensors includes at least eight sensors.

8. The apparatus of claim 2 wherein said insulating stand-off assembly further includes a plate separating said stand-off assembly at an intermediate position; and wherein said plate is thermally coupled to a higher temperature stage of said cryogenic refrigerator.

9. The apparatus of claim 8 wherein said insulating plate further includes a substantially perpendicular extension on which at least one laser sensor is mounted.

10. The apparatus of claim 9 wherein said insulating plate extension has at least two laser sensors mounted on it and said cold-head assembly support has at least four laser sources mounted on it.

11. The apparatus of claim 10 wherein said laser sensors receive light through a second window in said second housing portion, wherein said second window lies in a plane substantially perpendicular to the plane containing said first window in said second housing portion.

12. Apparatus for operating a plurality of laser sources and/or sensors, comprising:
 a chamber within a cold-shield, wherein said cold-shield is within a vacuum housing;
 a cryogenic refrigerator;
 means for mounting a plurality of laser sources and/or sensors, comprising,
 support means;
 first mounting menas mechanically coupled to said support means; and
 second mounting means mechanically and thermally coupled to said first mounting means; and
 means for conducting heat between said cryogenic refrigerator and said means for mounting.

13. The apparatus of claim 12 wherein said second mounting means includes a first portion for coupling to said first mounting means, and a second portion substantially perpendicular to said first portion for mounting of said laser sources and/or sensors.

14. The apparatus of claim 13 wherein at least eight laser sensors are mounted to said second portion of said second mounting means.

15. The apparatus of claim 13 wherein at least ten laser sources are mounted to said second portion of said second mounting means.

16. The apparatus of claim 12 wherein said cold-shield includes a first body portion and a second body portion having an aperture, wherein said second body portion substantially shields said second mounting means.

17. The apparatus of claim 16 wherein said vacuum housing includes a first body portion and a second body portion having a window, wherein said second body portion substantially houses said second body portion of said cold-shield.

18. The apparatus of claim 12 wherein said support means includes a separating plate thermally coupled to a higher temperature stage of said cryogenic refrigerator; and wherein laser sensors are mounted to said separating plate and laser sources are mounted to said second mounting means to provide simultaneous operation at two different temperatures.

19. The apparatus of claim 18 wherein said laser sensors are mounted to said separating plate on a portion of said plate folded to the perpendicular of the separating portion of said plate, and wherein said sensors receive light through a second window in said cold-shield.

* * * * *

UNITED STATES PATENT AND TRADEMARK OFFICE
CERTIFICATE OF CORRECTION

PATENT NO. : 4,873,843
DATED : October 17, 1989
INVENTOR(S) : Curt Van Vloten

It is certified that error appears in the above-identified patent and that said Letters Patent is hereby corrected as shown below:

On the title page, item [75]:
Inventor's name "V. Volten" change to - - Van Vloten- -

Col. 1, line 60 "of sources" change to - - or sources - -

Col. 4, Claim 6, line 62 "sources" change to - - sensors- -

Col. 5, Claim 12, line 24 "menas" change to - - means- -

Signed and Sealed this

Sixteenth Day of October, 1990

*Attest:*

HARRY F. MANBECK, JR.

*Attesting Officer*      *Commissioner of Patents and Trademarks*